(12) United States Patent
Iwamoto et al.

(10) Patent No.: US 7,387,686 B2
(45) Date of Patent: Jun. 17, 2008

(54) FILM FORMATION APPARATUS

(75) Inventors: Kunihiko Iwamoto, Ibaraki (JP);
Toshihide Nabatame, Ibaraki (JP);
Koji Tominaga, Kyoto (JP); Tetsuji Yasuda, Ibaraki (JP)

(73) Assignee: Rohm Co., Ltd. (JP)

( * ) Notice: Subject to any disclaimer, the term of this patent is extended or adjusted under 35 U.S.C. 154(b) by 143 days.

(21) Appl. No.: 10/550,753

(22) PCT Filed: Mar. 24, 2004

(86) PCT No.: PCT/JP2004/004076

§ 371 (c)(1),
(2), (4) Date: Sep. 23, 2005

(87) PCT Pub. No.: WO2004/086481

PCT Pub. Date: Oct. 7, 2004

(65) Prior Publication Data

US 2006/0180082 A1    Aug. 17, 2006

(30) Foreign Application Priority Data

Mar. 25, 2003  (JP) .............................. 2003-083692

(51) Int. Cl.
C23C 16/00  (2006.01)
(52) U.S. Cl. .................. 118/729; 118/719; 118/724; 118/715; 118/725
(58) Field of Classification Search ................. 118/724
See application file for complete search history.

(56) References Cited

U.S. PATENT DOCUMENTS

| | | | | |
|---|---|---|---|---|
| 5,245,171 A | * | 9/1993 | Fox et al. .................... | 235/492 |
| 5,280,156 A | * | 1/1994 | Niori et al. .................. | 219/385 |
| 5,445,676 A | * | 8/1995 | Takagi ........................ | 118/719 |
| 5,683,518 A | * | 11/1997 | Moore et al. ................ | 118/730 |
| 5,683,606 A | * | 11/1997 | Ushikoshi et al. .......... | 219/544 |
| 5,730,801 A | * | 3/1998 | Tepman et al. ............. | 118/719 |
| 6,077,764 A | * | 6/2000 | Sugiarto et al. ............ | 438/597 |
| 6,156,149 A | * | 12/2000 | Cheung et al. ........... | 156/272.2 |
| 6,306,216 B1 | * | 10/2001 | Kim et al. .................. | 118/725 |
| 6,395,092 B1 | * | 5/2002 | Sugiarto et al. ............ | 118/695 |
| 6,500,742 B1 | | 12/2002 | Chern et al. | |
| 6,753,506 B2 | * | 6/2004 | Liu et al. .................... | 219/390 |
| 2002/0153579 A1 | | 10/2002 | Yamamoto | |
| 2002/0195437 A1 | * | 12/2002 | Kusuda ..................... | 219/390 |

(Continued)

FOREIGN PATENT DOCUMENTS

GB    2 181 458 A    4/1987

(Continued)

OTHER PUBLICATIONS

European Search Report for Application No. 04722958.8—1215 PCT/JP2004004076 dated Jan. 2, 2007.

(Continued)

*Primary Examiner*—Michael Cleveland
*Assistant Examiner*—Keath T Chen
(74) *Attorney, Agent, or Firm*—Cantor Colburn LLP

(57) ABSTRACT

A metal atomic layer and an oxygen atomic layer are formed in this order by ALD, followed by rapid heating through RTA (Rapid Thermal Annealing). This cycle of steps is repeated to form a high dielectric constant film.

9 Claims, 16 Drawing Sheets

U.S. PATENT DOCUMENTS

2003/0031793 A1    2/2003  Chang et al.

FOREIGN PATENT DOCUMENTS

| JP | 08-288283 | 11/1996 |
| JP | 2001-152339 | 6/2001 |
| JP | 2001-254181 | 9/2001 |
| JP | 2002-314072 | 10/2002 |

OTHER PUBLICATIONS

International Prelimnary Report on Patentability for related International Application No. PCT/JP2004/004076 mailed Mar. 2, 2006.
International Search Report for Application No. PCT/JP2004/004076 mailed Jul. 13, 2004.

* cited by examiner

○ METAL ATOM  ◉ OXYGEN ATOM  ● IMPURITY

○ METAL ATOM  ◉ OXYGEN ATOM  ● IMPURITY

○ METAL ATOM  ◉ OXYGEN ATOM  ● IMPURITY

○ METAL ATOM  ◉ OXYGEN ATOM  ● IMPURITY

PRIOR ART

FILM FORMATION APPARATUS

BACKGROUND OF THE INVENTION

This is a U.S. national stage of application No. PCT/JP2004/004076, filed on 24 Mar. 2004. Priority under 35 U.S.C. §119(a) and 35 U.S.C. §365(b) is claimed from Japanese Application No. 2003-083692, filed 25 Mar. 2003, the disclosure of which is also incorporated herein by reference.

1. Field of the Invention

The invention relates to a deposition system which is capable of forming a metal compound thin film by atomic layer.

2. Description of the Related Art

In recent years, intensive studies have been made on the use of high dielectric constant thin films, called high-k, as materials for constituting semiconductor devices. High dielectric constant thin films are formed by such methods as CVD (Chemical Vapor Deposition), ALD (Atomic layer deposition), and sputtering. Of these, ALD is a method for forming a thin film by cyclic supply of reactants for chemical substitution, not by thermal decomposition. This method provides a superior capability for split-level coating as compared to physical deposition methods such as sputtering, and also allows low-temperature processes. It is thus considered as a promising method for forming a high dielectric constant thin film to constitute a semiconductor device (for example, see Japanese Laid-Open Patent Applications 2001-152339, 2001-254181, and 2002-314072).

A system for conducting this ALD-based deposition appears in Japanese Laid-Open Patent Application 2001-254181. This deposition system is one for achieving the process of supplying a first source gas to a substrate placed in a deposition chamber, purging this source gas, and then supplying a second source gas thereto. Switching the source gases and the purge gas alternately at speed allows deposition through the foregoing process, whereby atomic layers can be deposited layer by layer.

Now, Japanese Laid-Open Patent Application 2002-314072 (FIG. 8) describes a deposition system which has a chamber for performing deposition processing and a chamber for performing preprocessing separately. FIG. 14 is a diagram schematically showing the structure of this ALD system. The same document describes that when the ALD system deposits $Al_2O_3$ on a silicon substrate, terminating hydrogen on the silicon surface shall be desorbed. For example, this hydrogen desorption process is performed in an atmosphere of 400° C. or above in temperature, whereas $Al_2O_3$ is deposited at around 300° C. When these processes are performed continuously in an ordinary ALD system, the sample must be once raised to 400° C. or above in temperature for the sake of the hydrogen desorption process, and then the deposition is performed after a wait until the sample temperature falls to around 300° C. Then, performing the series of operations wafer by wafer increases the number of processes of the ALD system, thereby making the cost of the semiconductor device higher.

The deposition system shown in FIG. 14 is to address this problem. The ALD system has a sample introduction chamber 13 which accommodates to-be-processed and processed samples, a reaction chamber 12 where depositing a predetermined film on a sample is carried out, and a conveyor system which conveys the samples in succession. Aside from these, the ALD system is also provided with a hydrogen desorption chamber 11 which performs the hydrogen desorption process. In the hydrogen desorption chamber 11, the hydrogen desorption process is carried out by using a heating lamp 16. This configuration allows the hydrogen desorption process and the deposition of the dielectric film, having different processing temperatures, to be performed continuously. Because of the provision of the respective chambers for performing the deposition processing and the preprocessing, it is possible to perform the processes continuously without waiting for the temperature to settle. Then, it has been concluded that the number of processes of the semiconductor device can be decreased to reduce the manufacturing cost of the semiconductor device.

Any of the deposition systems for performing such ALD-based deposition is basically configured so that a source gas and a purge gas are supplied alternately. Hereinafter, a typical ALD deposition process to be achieved by these deposition systems will be described with reference to FIG. 1. Here, the description will deal with the case of an aluminum oxide film.

Initially, a substrate is placed in the reactive chamber, and then a film material A is supplied to the surface of the substrate. Here, trimethyl aluminum ($Al(CH_3)_3$; referred to as "TMA") is supplied (S101).

Next, the material A is exhausted from the reaction chamber by inactive gas purging (S102). Next, a reactive gas is supplied to the reaction chamber (S103). The reactive gas may be oxygen, water vapor, or the like. As a result, an oxygen atomic layer is formed on the atomic layer made of the material A. To remove resulting by-products and the reactive gas hanging in the vapor phase, inactive gas purging is then performed to exhaust the air (S104).

The foregoing steps S101 to S104 are repeated to form a high dielectric constant thin film. Subsequently, whether a predetermined thickness is reached or not is checked by a thickness measuring device which is arranged on the deposition system (S107). If it is confirmed that the predetermined thickness is reached (Yes at S107), then thermal annealing is performed for the sake of film refining processing (S108). This thermal annealing is performed after the completion of the layer formation (Japanese Laid-Open Patent Application No. 2001-152339, paragraph 0047). This completes the deposition steps.

In such a deposition process, however, impurities resulting from the materials used in the ALD have sometimes remained in the high dielectric constant thin film or induced film defects. In this respect, description will be given with reference to FIGS. 2A and 2B. FIGS. 2A and 2B are schematic diagrams showing the layer structure of a high dielectric constant thin film formed by the steps of FIG. 1. FIGS. 2A and 2B correspond to the states before and after the film refining processing by the thermal annealing shown in S108 of FIG. 1, respectively.

Before the thermal annealing, as shown in FIG. 2A, impurities are distributed throughout the high dielectric constant thin film. After the annealing, impurities are removed from the entire film. The film is also densified. Nevertheless, in the lower areas of the high dielectric constant thin film or near the substrate in particular, impurities tend to be removed insufficiently and remain intact. In addition, since metal oxides are typically prone to crystallization, the film can be partially crystallized in the annealed state of FIG. 2B. The residual impurities and the film crystallization described above may contribute to deterioration in the characteristics of the device that contains the high dielectric constant thin film. For example, when the high dielectric constant thin film is applied to the gate insulating film of a transistor, it may cause an increase in leak current, deviations in threshold characteristics, etc.

To solve these problems, it is desired to adopt a deposition method that not only supplies the source gases and the purge gas alternately but also exercises control of higher sophistication on the film quality. To achieve such a new deposition method, the deposition system itself must also be sophisticated in function.

Related Art List
JPA laid open 2001-152339
JPA laid open 2001-254181
JPA laid open 2002-314072 (FIG. 8)

SUMMARY OF THE INVENTION

The present invention has been achieved in view of the foregoing problems. It is thus an object of the present invention to provide a deposition system which suppresses impurity contamination and film defects so that a thin film of favorable quality is obtained stably by ALD. Another object of the present invention is to provide a deposition system which is capable of introducing a different type of component into the thin film in a desired distribution.

The present invention provides a deposition system which supplies a source gas and a purge gas alternately for deposition, comprising: a deposition chamber; a substrate holding unit which holds a substrate in the deposition chamber; a source gas supply unit which supplies the source gas to the deposition chamber; a reactive gas supply unit which supplies a reactive gas to the deposition chamber; a purge gas supply unit which supplies the purge gas to the deposition chamber; an exhaust unit which exhausts the source gas, the reactive gas, and the purge gas from the deposition chamber; a first heating unit which heats the substrate arranged in the deposition chamber to maintain the same to a predetermined temperature; and a second heating unit which heats the substrate arranged in the deposition chamber rapidly.

In the present invention, the "reactive gas" refers to a gas that reacts with a metal to form a metal oxide or a metal nitride. The deposition system according to the present invention has the first and second heating units which heat the substrate arranged in the deposition chamber. The first heating unit can be used to maintain the substrate at a deposition temperature for depositing an atomic layer, and the second heating unit can be used to heat the substrate rapidly. It is therefore possible to perform both an atomic layer deposition step and an annealing step in the same deposition chamber without taking out the substrate. The two steps can also be switched quickly for deposition. Specifically, it is possible to achieve the deposition process of forming a layer by atomic layer deposition, performing annealing, and forming a layer again.

When the layer forming step is suspended to interpose annealing, impurities mixed in the layer and defects of the layer can be removed sufficiently. The film can also be densified. Moreover, in the annealing step, an annealing gas such as ammonia can be introduced to form a nitrogen-introduced layer or the like inside the thin film freely through annealing. With a conventional deposition system, the deposited substrate has been taken out of the deposition system and loaded into another system for annealing. In contrast, according to the system of the present invention, the atomic layer and the annealing can be performed in the same deposition system. The deposition process described above can thus be achieved stably.

In the present invention, the source gas, the reactive gas, or the purge gas may be introduced in a direction parallel to the surface of the substrate. For example, when the system is configured to introduce the purge gas in a direction-parallel to the substrate, the surface of the substrate can be supplied with those gases efficiently so that a thin film of favorable quality is obtained stably.

In the present invention, the first heating unit and the second heating unit may be opposed to each other with the substrate interposed therebetween, so that the first heating unit heats the substrate from the backside and the second heating unit heats the substrate from the surface. This allows efficient heating by both the heating units. Incidentally, in the present invention, the surface of the substrate refers to the side to be subjected to deposition.

In the present invention, the deposition system may further comprise an annealing gas introducing unit which introduces an annealing gas to the deposition chamber. This allows the process of forming a nitrogen-introduced layer or the like in a desired position inside the thin film through annealing as described above. In addition, an oxidant gas, a reductant gas, or the like can be introduced as the annealing gas during annealing, whereby impurities can be removed efficiently.

In the present invention, the second heating unit may be an RTP (Rapid Thermal Processing) unit such as an infrared lamp, a laser annealing unit, and a flashing unit. In this case, the rapid heating of the substrate can be conducted stably, so that the process of repeating the atomic layer deposition and the annealing in succession can be conducted stably.

The second heating unit may be arranged outside the deposition chamber. This can effectively suppress contamination of the second heating unit with the source gas, the reactive gas, and the like.

The first heating unit may be a heater formed on a substrate holding surface of the substrate holding unit, for example. This makes it possible to heat the backside of the substrate by heat conduction or radiation. The substrate can thus be maintained at the deposition temperature stably.

In the present invention, the configuration capable of purging quicker than in conventional systems allows the substrate temperature to be cooled rapidly. After annealing, it is thus possible to cool the substrate rapidly and switch to the next atomic layer deposition step speedily. Consequently, both the deposition and the annealing can be performed in the same deposition chamber. This achieves a deposition system which suitably suppresses impurity contamination and film defects. Moreover, since the process of forming a nitrogen-introduced layer or the like in a desired position inside the thin film through annealing becomes feasible, a different type of component can be introduced into the thin film in a desired distribution with reliability. This makes it possible to form a high-quality film having a desired component distribution stably.

In the present invention, the substrate holding unit may have a moving mechanism which moves the substrate in position so that the distance between the substrate and the second heating unit can be adjusted by an operation from outside the deposition chamber without opening the deposition chamber. A high-flow purge gas supply unit and a corresponding exhaust unit may also be provided so that the rapid heating and rapid cooling of the substrate can be performed more smoothly.

In the present invention, the deposition system may further comprise an annealing gas introducing unit which introduces an annealing gas into the deposition chamber. When the substrate is put closer to the second heating unit by the moving mechanism, the substrate or the substrate holding unit may section the deposition chamber into a first chamber having the annealing gas introducing unit and a second chamber having the source gas supply unit and the reactive gas supply unit so that the surface of the substrate is exposed to the first chamber. In this case, the annealing is performed in part of the internal space of the deposition chamber. This further improves the temperature controllability in the process of rapid heating. Moreover, in introducing the annealing gas into the film, it is possible to control the amount of introduction with high precision. Furthermore, at the time of annealing, the substrate need not be moved from the deposition chamber to a separate annealing chamber. The operations from the deposition to the annealing can be performed continuously in the deposition chamber.

In the foregoing configuration, the source gas supply unit and the reactive gas supply unit can be arranged outside the small chambers for the sake of an improvement to the durability of the deposition system. When the annealing gas is mixed with the source gas or the reactive gas, there may occur a corrosive gas which sometimes corrodes the inner walls of the deposition chamber. The foregoing configuration can thus be adopted to suppress the production of such a corrosive gas, thereby improving the durability of the deposition chamber.

The first and second chambers may be formed inside the deposition chamber in various possible modes.

For example, the substrate holding unit and the inner walls of the deposition chamber may form a first chamber of enclosed structure when the substrate is put closer to the second heating unit. This simple configuration can form the small chambers inside the deposition chamber easily, and allows more efficient heating by the second heating unit.

Alternatively, a partition member may be arranged inside the deposition chamber. When the substrate is put closer to the second heating unit by the moving mechanism, the substrate or the substrate holding unit may be combined with the partition member to form a division wall inside the deposition chamber, thereby forming the first and second chambers. This can suppress the flow of the annealing gas into the second chamber, whereby corrosion of the inner walls of the deposition chamber is suppressed with reliability. Since the flow of the reactive gas into the first chamber is also suppressed, it is possible to suppress chemical reactions other than intended during annealing.

The deposition system of the present invention may have a control unit which controls the operation of the second heating unit and the moving mechanism. The control unit may be configured to start heating the substrate by using the second heating unit after the substrate is put closer to the second heating unit by the moving mechanism. This makes it possible to heat the substrate even more efficiently.

The deposition system of the present invention may further comprise: an annealing gas introducing unit which introduces an annealing gas to the deposition chamber; and a control unit which controls the operation of the second heating unit, the annealing gas introducing unit, and the moving mechanism. The control unit may be configured to start heating the substrate by using the second heating unit and introduce the annealing gas to the deposition chamber from the annealing gas introducing unit when the substrate is put closer to the second heating unit by the moving mechanism. This makes it possible to form a high-quality film with still higher reliability at speed.

In the deposition system of the present invention, the exhaust unit may also be controlled by the control unit so that it can exhaust air from the entire deposition chamber when the substrate is put away from the second heating unit by the moving mechanism. Consequently, the entire deposition chamber including the area that makes the small chamber when the substrate is put closer to the second heating unit can be exhausted simultaneously. This makes it possible to perform gas replacement and cooling inside the deposition chamber with reliability at higher speed.

The deposition system of the present invention is suitably used to form a metal compound layer made of a high dielectric constant material so-called high-k. Here, the thin film may have a dielectric constant k of 8 or higher, for example. The metal compound layer may contain one or more elements selected from the group consisting of Hf, Zr, Al, La, Y, Si, Ba, Sr, Ti, Pb, Bi, Ta, Nb, and Mn. Among these, any of Hf, Zr, Al, La, and Y is particularly preferably contained. This can provide a stable film having a high dielectric constant.

Specifically, the deposition system can suitably manufacture a film of a compound expressed by the following general formula:

$$M_y N_{1-x} O_x,$$

where x is a number ranging from 0 to 1, and y is a number higher than 0 but no higher than 1. Here, M represents one or more metal elements. Specific examples of the metal elements include the ones mentioned above.

Concrete examples of the compound expressed by the foregoing general formula include: metal oxides such as $Al_2O_3$, $ZrO_2$, $HfO_2$, $Ta_2O_5$, $Nb_2O_5$, $CeO_2$, $Y_2O_3$, $IrO_2$, $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, and $(Ba,Sr)RuO_3$; oxynitrides formed by introducing nitrogen into the foregoing metal oxides; and metal nitrides such as AlN and $Hf_3N_4$. High dielectric constant films made of high dielectric constant materials having relative permittivities of 10 and above are particularly preferable. Such films may be suitably used for the gate insulating film of a MIS (Metal Insulator Semiconductor) type transistor or the capacitive film of a capacitor.

According to the deposition system of the present invention, it is possible to perform the steps of depositing an atomic layer, performing the annealing in an atmosphere containing a nitrogen compound gas, and then depositing another atomic layer continuously without taking the substrate out of the deposition chamber. Through these steps, a metal nitride layer or metal oxynitride layer can be introduced into an arbitrary position in the metal compound layer of a high dielectric constant material. In general, high dielectric constant films made of metal oxide layers are high in insulation capability, whereas they have a propensity toward crystallization and to pass leak currents easily. When nitrogen is introduced thereto, the crystallization temperatures of the layers increase to enhance the film quality and make it harder to pass leak currents. According to the present invention, such films can be formed stably with excellent controllability.

As described above, according to the present invention, impurity contamination and film defects can be suppressed to obtain a high dielectric constant thin film of favorable quality stably by ALD. It is also possible to introduce a different type of element such as nitrogen into the entire high dielectric constant thin film in a desired distribution.

BRIEF DESCRIPTION OF THE DRAWINGS

The foregoing objects and other objects, features, and advantages of the invention will become more apparent from the following description of preferred embodiments when read in conjunction with the accompanying drawings, in which.

DETAILED DESCRIPTION OF THE INVENTION

First Embodiment

Figure 1:
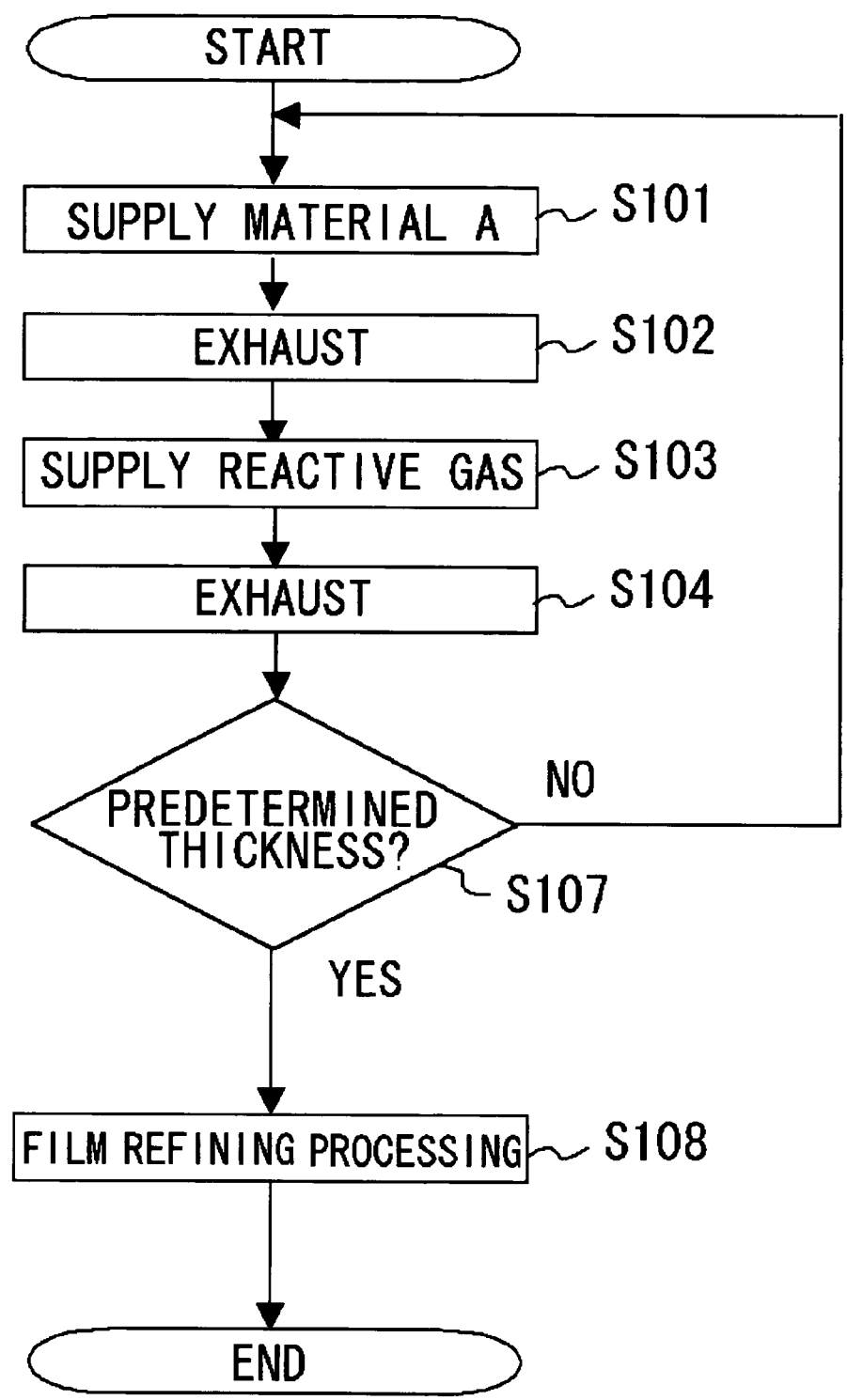
FIG. 1 is a flowchart for explaining conventional typical steps for forming a high dielectric constant thin film by ALD.
Figure 2A:
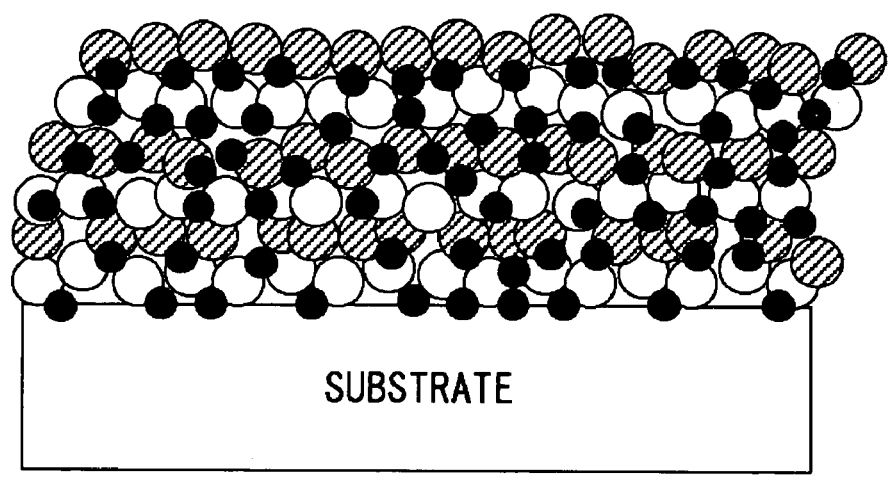
FIGS. 2A and 2B are schematic diagrams showing the layer structure of a high dielectric constant thin film formed by the steps of FIG. 1.
Figure 2B:
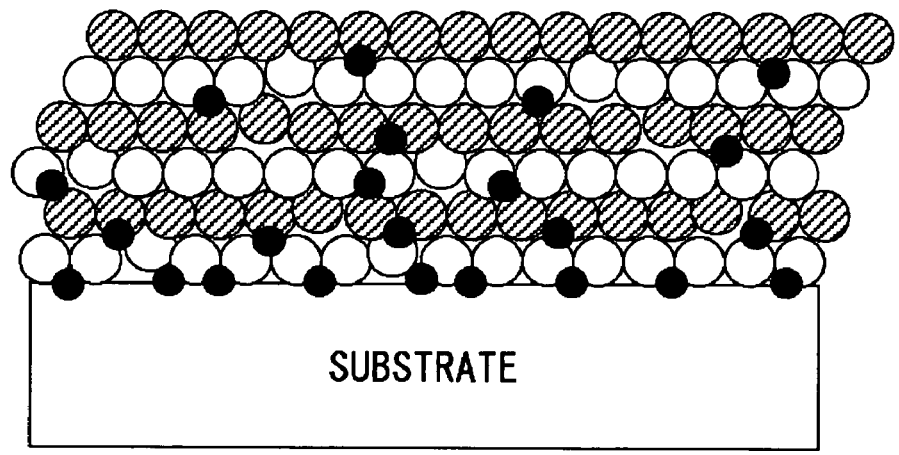
Figure 3:
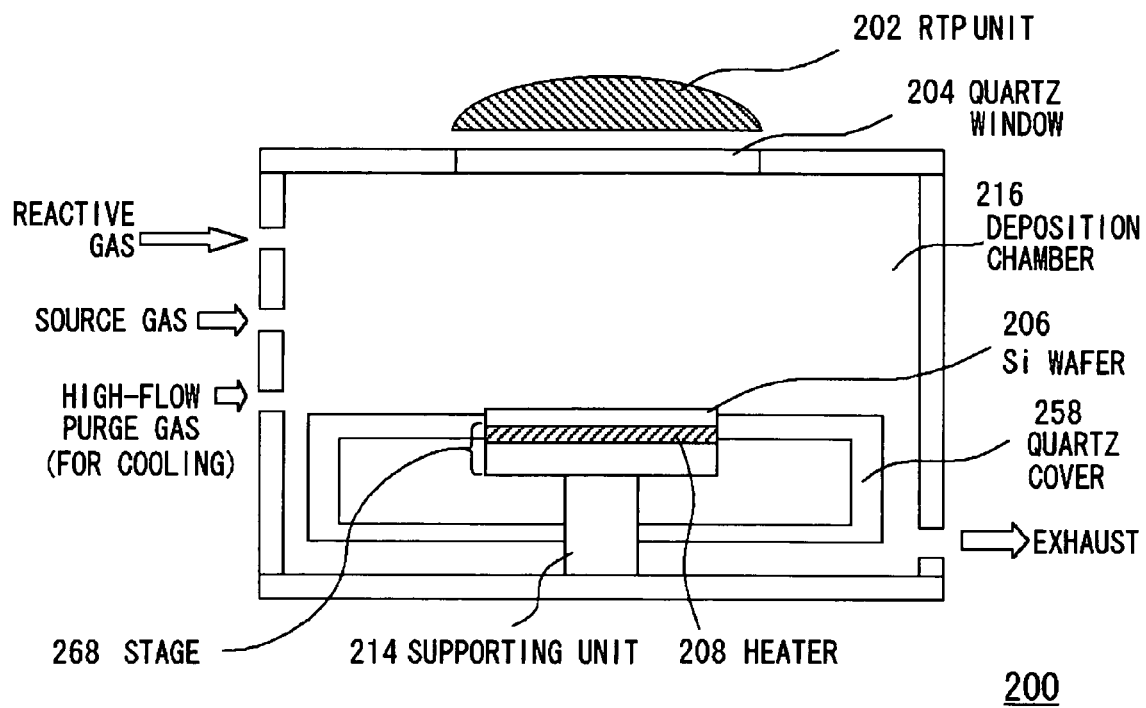
FIG. 3 is a diagram showing the configuration of a deposition system according to an embodiment.

FIG. 3 is a diagram showing the configuration of a deposition system according to the present embodiment. In the shown deposition system 200, an Si wafer 206 is placed on a stage 268 which is provided with a heater 208. The stage 268 is supported by a supporting unit 214. Inlets for a reactive gas ($H_2O$), a source gas of a metal compound, and a purge gas are formed in the system. An outlet for exhausting the gases out of the deposition chamber is formed in the right side of the system. A quartz cover 258 is provided in order to prevent gas components from adhering to the stage 268 and the supporting unit 214.

An RTP unit 202 is installed over a quartz window 204 which is formed in a wall of the deposition chamber 216. The Si wafer 206 is maintained at a predetermined temperature by the heater 208 during deposition, and is heated rapidly by the RTP unit 202. That is, the heater 208 is a heat source for maintaining the Si wafer 206 at a predetermined deposition temperature, or the deposition temperature shown in FIG. 7B to be seen later, during deposition. The RTP unit 202 is a heat source for reaching the annealing temperature during thermal annealing. The RTP unit 202 may be a rapid thermal processing unit such as an infrared lamp, a laser annealing unit, and a flashing unit.

In this system, the deposition chamber 216 is given a volume ratio significantly smaller than heretofore with respect to the flow rate of the purge gas. The interior of the deposition chamber 216 can thus be replaced with the cooling purge gas of high flow rate in a short time. Consequently, it becomes possible to lower the temperature inside the deposition chamber 216 sharply. Moreover, the RTP unit 202 attached to the deposition system 200 allows a quick rise in temperature.

Figure 4:
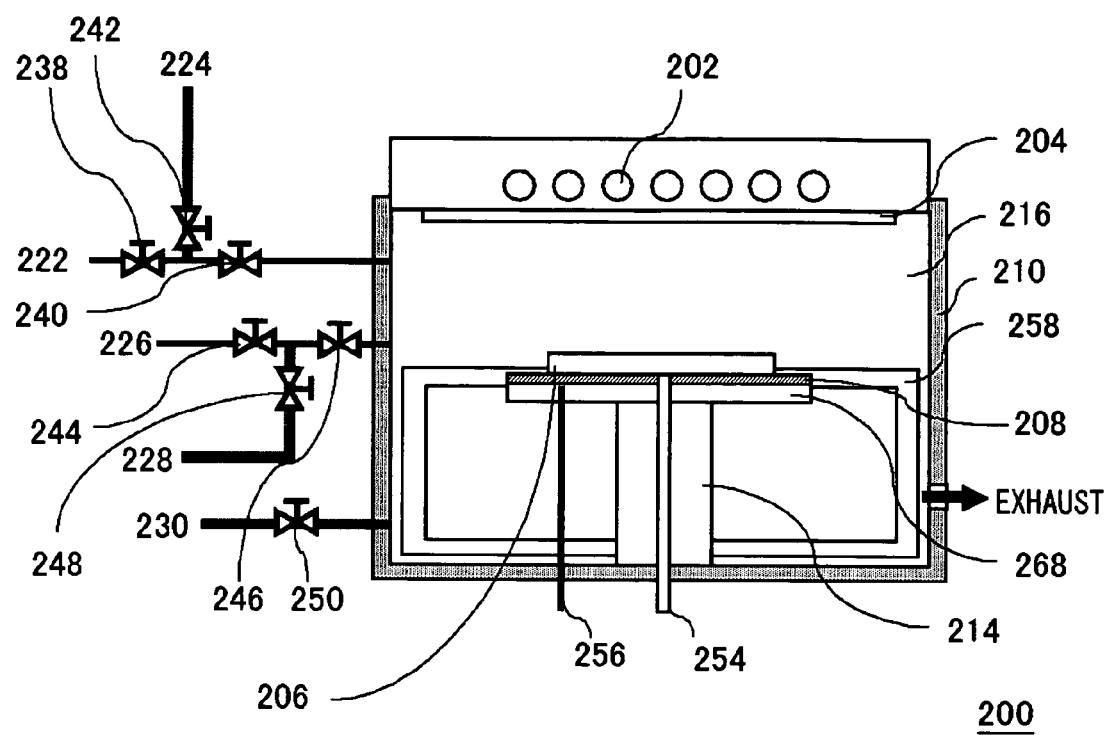
FIG. 4 is a diagram showing the configuration of the deposition system according to the embodiment.

FIG. 4 is a diagram showing the configuration of the deposition system 200 in more details. Here, the configuration of the piping connected to the deposition chamber 216 is shown. Valves 238 and 240 are formed on a source gas supply pipe 222 for supplying the source gas of a metal compound thin film to the deposition chamber 216. The source gas supply pipe 222 is connected with a tank, a cylinder, or the like that contains the source gas. A purge gas supply pipe 224 communicating with the source gas supply pipe 222 is provided with a valve 242. Incidentally, the source gas may be the material of a high dielectric constant film (high-k material). In this case, a metal compound thin film having a high dielectric constant can be suitably formed on the surface of the Si wafer 206.

Valves 244 and 246 are formed on a reactive gas supply pipe 226 for supplying the reactive gas ($H_2O$) to the deposition chamber 216. The reactive gas supply pipe 226 is connected with a tank, a cylinder, or the like that contains the reactive gas. A purge gas supply pipe 228 communicating with the reactive gas supply pipe 226 is provided with a valve 248. A purge gas supply pipe 230 for introducing a large amount of cooling purge gas into the deposition chamber 216 is provided with a valve 250.

In the deposition system 200, the source gas supply pipe 222, the purge gas supply pipe 224, the reactive gas supply pipe 226, the purge gas supply pipe 228, and the purge gas supply pipe 230 may be made of any materials as long as they have resistance against the gas components flowing through the respective pipes and against the temperatures thereof. For example, stainless steel pipes may be used. The valves 238 to 250 may be configured so that they are opened and closed under the control of a not-shown computer, for example.

The walls of the deposition chamber 216 may be made of any material as long as it has resistance against heat, oxidants, and reductants. For example, stainless steel or other metals may be used. A heat insulating cover 210 may be arranged on the external walls of the deposition chamber 216. The heat insulating cover 210 may be made of glass wool, for example.

Now, the method of manufacturing a thin film by using the deposition system 200 will be described with reference to FIG. 5. Initially, an Si wafer 206 is placed in the deposition chamber 216. Then, a film material A is introduced from the source gas supply pipe 222 into the deposition chamber 216 and is supplied to the surface of the Si wafer 206 (S101). Here, the valves 238 and 240 are open, and the valve 242 is closed. The material A is a metal compound. For example, trimethyl aluminum (TMA) is used to form an aluminum oxide layer. To deposit $ZrO_2$, such a source gas as zirconium chloride ($ZrCl_4$) is selected and used as appropriate. To deposit $HfO_2$, such source gases as hafnium chloride ($HfCl_4$) and hafnium propoxide (Hf (iOPr)$_4$) may be used. During deposition, the temperature of the Si wafer 206 is adjusted by the heater 208. The temperature of the heater 208 is measured by a temperature measuring unit 256.

Subsequently, purging is performed by using an inactive gas, so that the material A is exhausted (S102). Here, the valve 238 is closed and the valve 242 is opened to supply the purge gas from the purge gas supply pipe 224. This makes it possible to eliminate the source gas remaining in the source gas supply pipe 222.

Next, the reactive gas is supplied from the reactive gas supply pipe 226 to the deposition chamber 216 (S103). Here, the valves 244 and 246 are opened, and the valve 248 is closed. The examples of the reactive gas include $H_2O$, $O_3$, $O_2$, $N_2O$, $NH_3$, and NO. Consequently, an oxygen atomic layer is formed on the atomic layer made of the material A. To remove the reactive gas and resulting by-products hanging in the vapor phase, inactive gas purging is performed to exhaust the air (S104). Here, the valve 244 is closed and the valve 248 is opened to introduce the purge gas from the purge gas supply pipe 228. Consequently, the reactive gas in the reactive gas supply pipe 226 can be removed suitably.

Subsequently, thermal annealing is conducted for the sake of impurity removal processing and film reforming processing (S105, S106). This annealing is carried out inside the deposition chamber 216 where the foregoing steps S101 to S105 are performed. That is, the Si wafer 206 is thermally annealed simply without being taken out of the deposition chamber 216. The annealing temperature is set as appropriate according to the film materials etc. Typically, an appropriate temperature is selected from the range of 400° C. to 1000° C. Incidentally, the heating temperature by the RTP unit 202 is adjusted based on the temperature measured by a radiation thermometer 254.

The cycle consisting of the foregoing steps S101 to S106 is repeated to stack atomic layers. Subsequently, whether a predetermined thickness is reached or not is checked by a thickness measuring device (not shown) which is arranged on the deposition system 200 (S107). If the predetermined thickness is not reached (No at S107), the annealed Si wafer 206 is cooled rapidly to repeat the steps from S101.

The rapid cooling of the deposition chamber 216 is effected by supplying the purge gas from the purge gas supply pipe 230 and exhausting the air from the outlet as well. This can cool the Si wafer 206 efficiently, so that the processing can be shifted from step S106 to S101 promptly. At S107, if it is confirmed that the predetermined thickness is reached (Yes at S107), the atomic layer forming steps are ended. Then, annealing is performed for the sake of film refining processing (S108).

Figure 5:
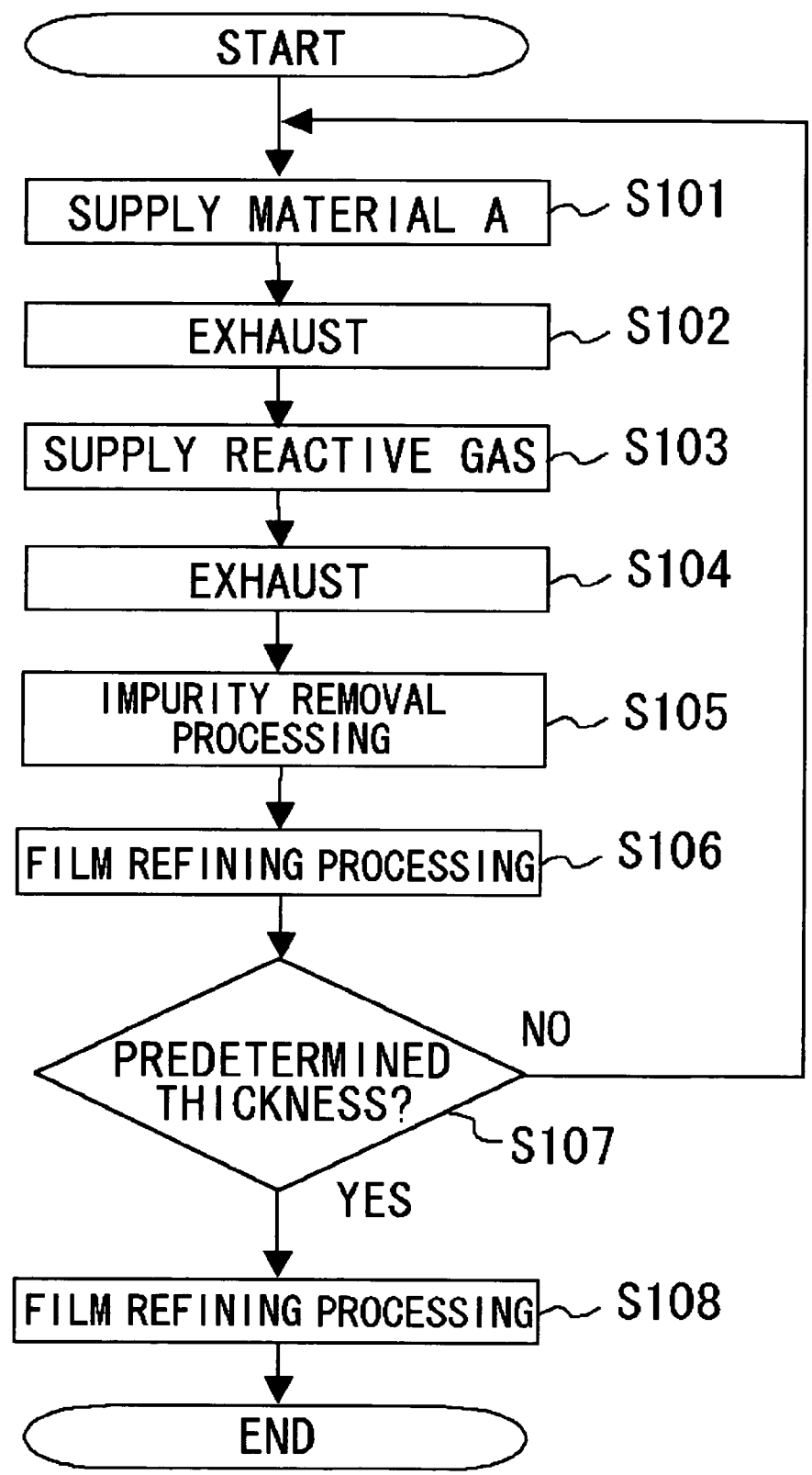
FIG. 5 is a flowchart for explaining the steps for forming a high dielectric constant thin film according to the embodiment.
Figure 6A:
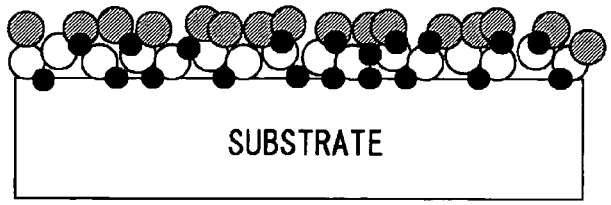
FIGS. 6A to 6D are schematic diagrams showing the layer structure of the high dielectric constant thin film formed by the steps of FIG. 5.
Figure 6B:
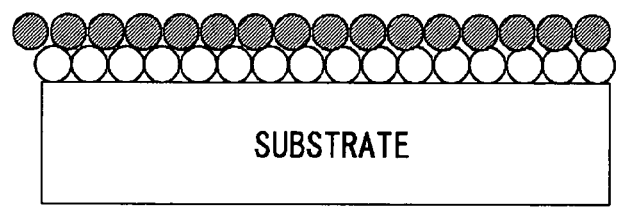
Figure 6C:
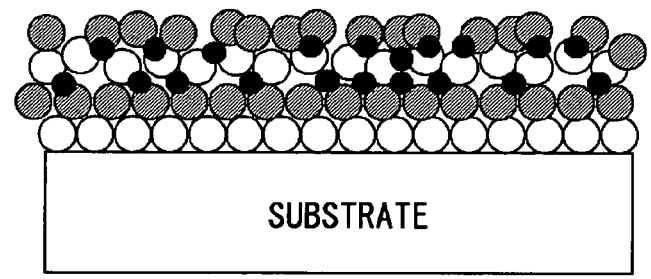
Figure 6D:
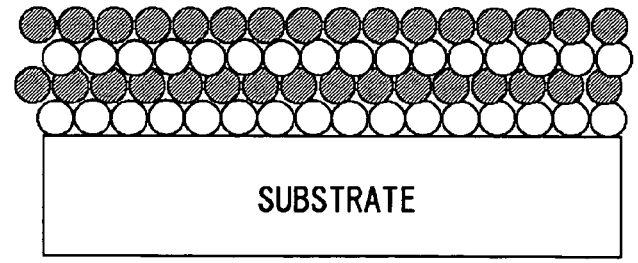

FIGS. 6A to 6D are diagrams schematically showing the process how atomic layers are stacked by the steps of FIG. 5. FIG. 6A shows the state after the execution of the steps S101 to S104 in FIG. 5. Metal atoms, oxygen atoms, and impurities are deposited on the substrate. FIG. 6B shows the state after the execution of the steps S105 and S106 in FIG. 5. The thermal annealing has removed the impurities from the film. FIGS. 6C and 6D show the layer structure at respective stages after the foregoing steps are repeated. The thermal annealing provides the densified layer structure having little impurities as shown in FIG. 6D.

Figure 7A:
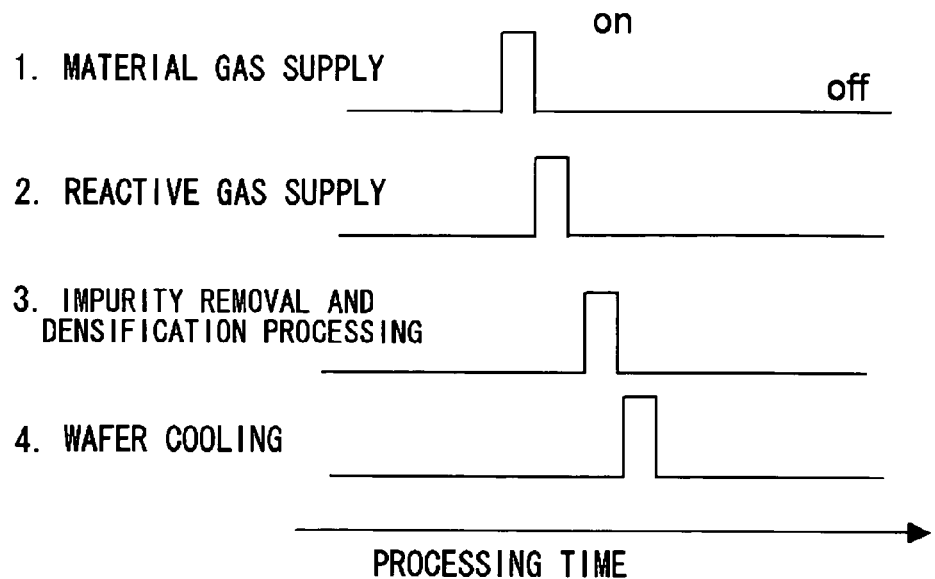
FIGS. 7A and 7B are diagrams showing the sequence of gas supply and wafer cooling.

The foregoing process will now be described further in terms of gas supply and a temperature profile. FIG. 7A is a diagram showing the sequence of gas supply and wafer cooling. Initially, the source gas for material is supplied (sequence 1). Next, the reactive gas is supplied (sequence 2). Subsequently, annealing is performed for the sake of impurity removal and film densification (sequence 3). Then, the Si wafer 206 is cooled (sequence 4) to complete a single cycle of deposition steps. This cycle is performed a plurality of times to form the high dielectric constant thin film.

Figure 7B:
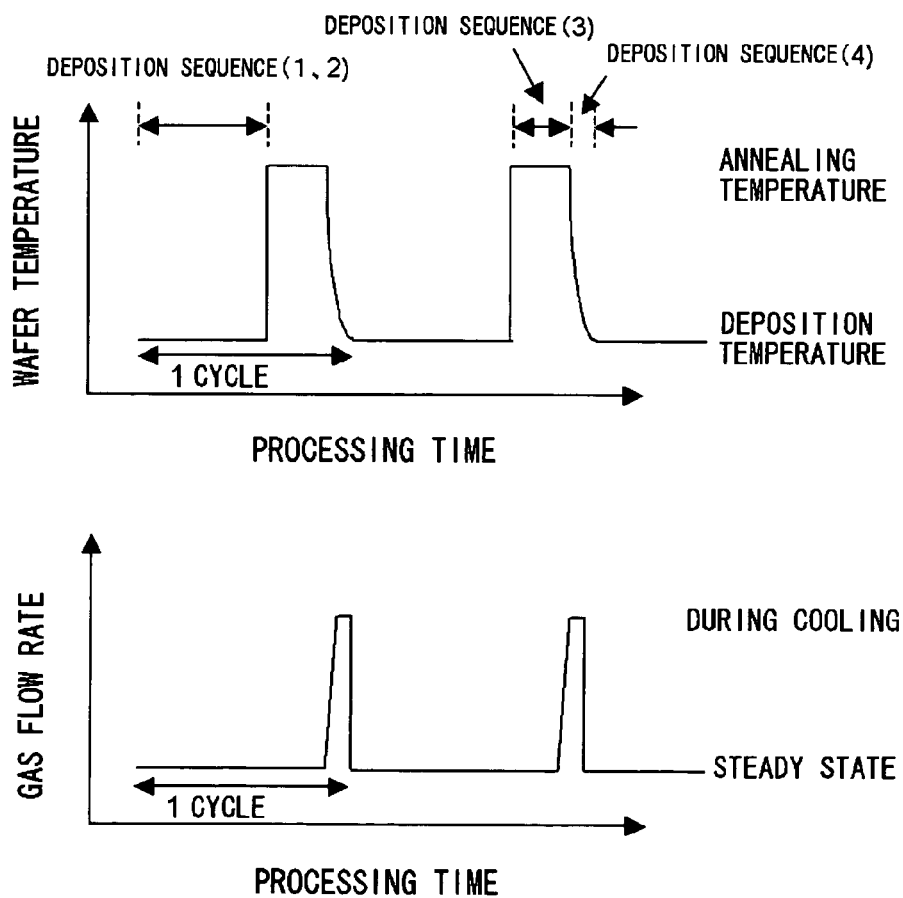

FIG. 7B is a diagram showing the relationship among the cycle, the temperature of the Si wafer 206, and the gas flow rate. The numerals given to the deposition sequence of FIG. 7B correspond to those of FIG. 7A. While the deposition sequences 1 and 2 are executed, the wafer temperature is maintained at a relatively low temperature. From the state after the completion of the deposition sequence 2, the temperature is increased rapidly by the RTP unit 202. The annealing is thus performed in the deposition sequence 3 (impurity removal, and densification). In the meantime, the wafer temperature is maintained high. The annealing is conducted by using an infrared lamp or laser annealing, and completed in a short time. Subsequently, the Si wafer 206 is cooled in the sequence 4. To achieve this process, it is of importance to increase the temperature of the Si wafer 206 rapidly and perform annealing without taking the Si wafer 206 out of the deposition chamber 216, and to lower the temperature of the Si wafer 206 sharply so as not to hinder the next deposition step. These requirements have been unattainable by conventional deposition systems. Since the deposition system 200 has the heater 208 and the RTP unit 202, it is possible to exercise high speed heating by the RTP unit 202 during annealing. Moreover, since the speed of introduction of the purge gas from the purge gas supply pipe 230 and the speed of exhaust of the purge gas from the outlet are significantly higher than in conventional systems, rapid cooling is also possible. This eliminates the need for the Si wafer 206 to be transported from the chamber for deposition to a chamber for annealing as in the conventional systems. As above, according to the deposition system 200, it is possible to increase the temperature of the Si wafer 206 and cool the same rapidly. Then, the deposition and the annealing both can be achieved in the deposition chamber 216. This allows the process of performing deposition, annealing, and deposition again. Impurity contamination and film defects can thus be suppressed suitably, so that a thin film of favorable quality can be obtained stably. In addition, since the deposition and the annealing can be performed at desired timing, it is possible to introduce different types of components into the thin film in a desired distribution.

Second Embodiment

Figure 8:
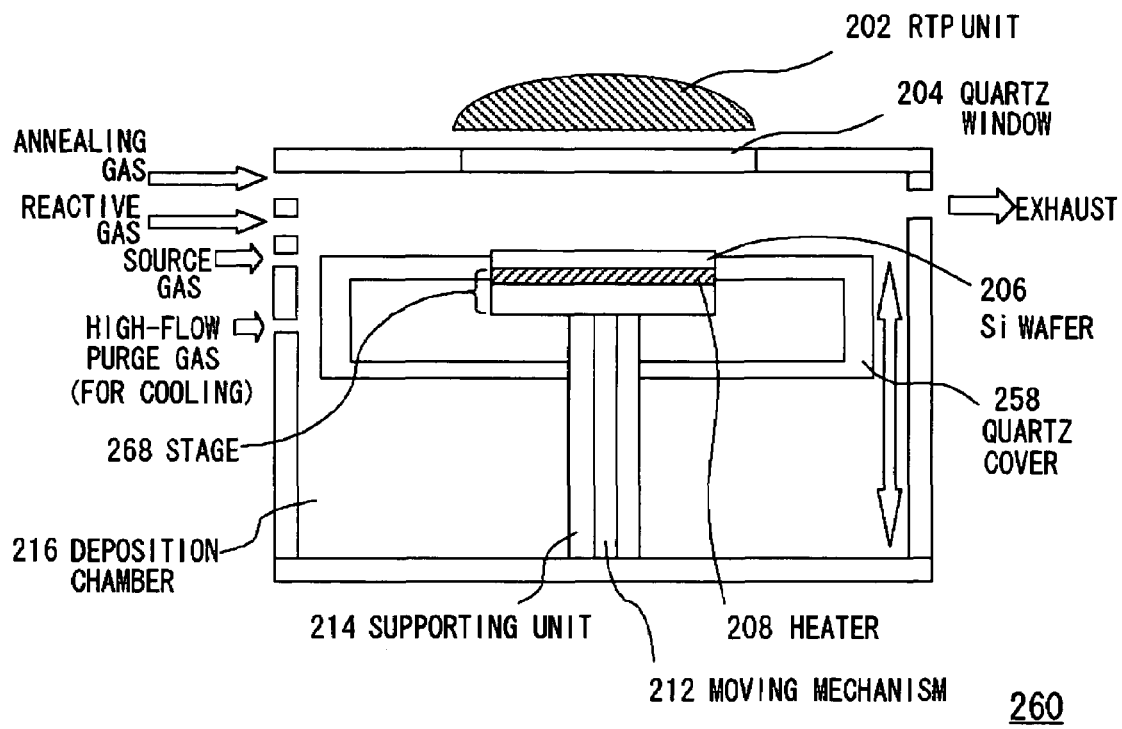
FIG. 8 is a diagram showing the configuration of the deposition system according to another embodiment.
Figure 9:
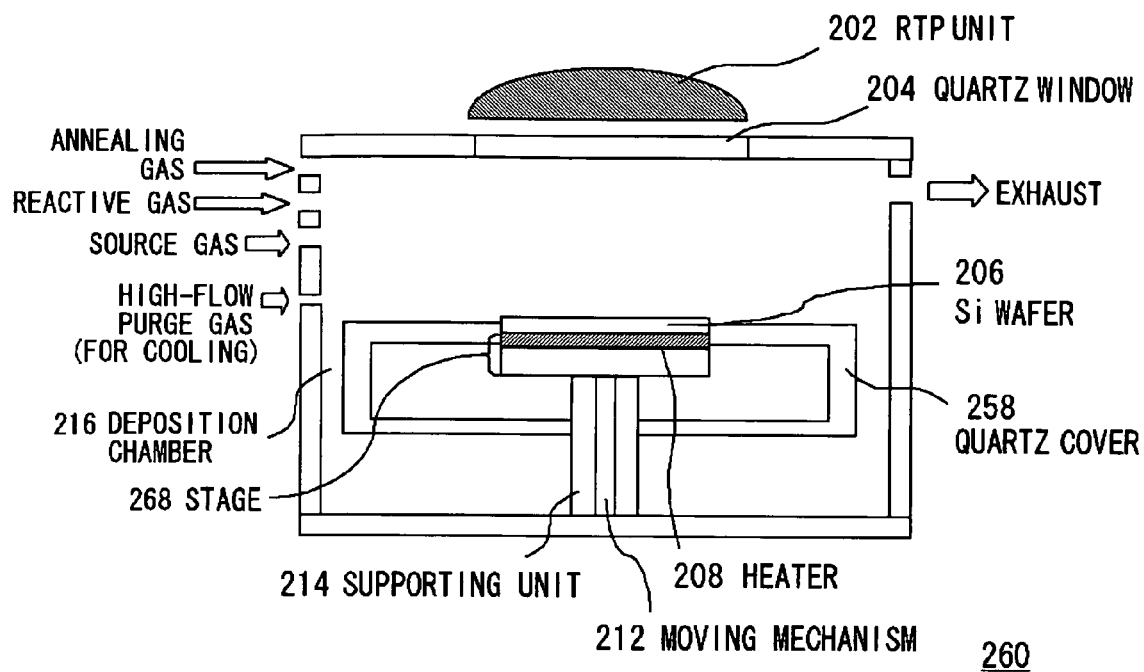
FIG. 9 is a diagram showing the configuration of the deposition system according to the embodiment.

FIGS. 8 and 9 are diagrams showing the configuration of a deposition system according to the present embodiment. FIG. 8 shows the state where a supporting unit 214 of the deposition system 260 is lifted. FIG. 9 shows the state where the supporting unit 214 is lowered. In the deposition system 260, the Si wafer 206 is placed on the supporting unit 214 which has a moving mechanism 212. The Si wafer 206 can thus be displaced in the height direction. For example, the moving mechanism 212 may be configured to extend and contract the supporting unit 214 electrically. The moving mechanism 212 for changing the height of the supporting unit 214 according to an operation on a switch arranged outside the deposition chamber 216 may be formed inside the supporting unit 214.

For rapid heating, the deposition system 260 moves the Si wafer 206 upward to approach the RTP unit 202 as shown in FIG. 8. For rapid cooling, on the other hand, the Si wafer 206 is moved downward to draw apart from the RTP unit 202 as shown in FIG. 9. Besides, the interior of the chamber is purged by a large amount of purge gas introduced from the purge gas supply pipe 230. In the deposition system 260, the outlet is formed in the upper part of the deposition chamber 216. The stage 268 and the gas supply channels have the same structures as in FIG. 6.

The deposition system 260 is configured so as to be capable of adjusting the distance between the RTP unit 202 and the Si wafer 206. In addition, the outlet lies in the upper part of the deposition chamber 216. This allows prompt gas exchange and temperature adjustment, thereby achieving a structure better suited for rapid heating and rapid cooling. At the time of heating, the distance between the RTP unit 202 and the Si wafer 206 is selected as appropriate according to such factors as the output of the RTP unit 202.

Third Embodiment

Figure 10:
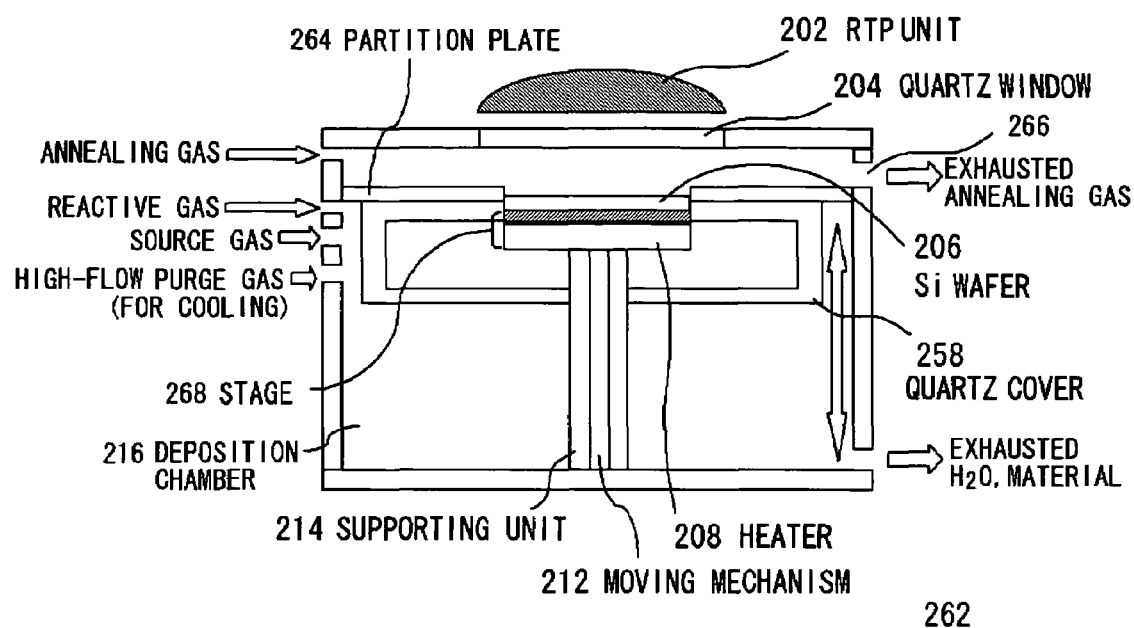
FIG. 10 is a diagram showing the configuration of the deposition system according to another embodiment.
Figure 11:
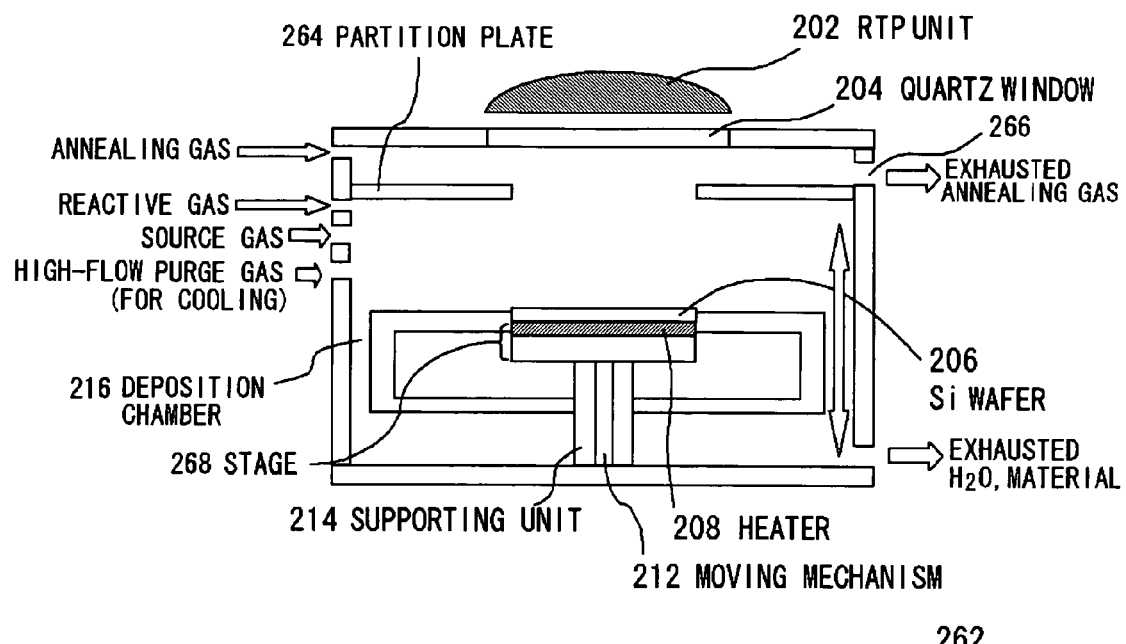
FIG. 11 is a diagram showing the configuration of the deposition system according to the embodiment.

FIGS. 10 and 11 are diagrams showing the configuration of a deposition system according to the present embodiment. FIG. 10 shows the state where a supporting unit 214 of the deposition system 262 is lifted. FIG. 11 shows the state where the supporting unit 214 is lowered. In this deposition system 262, the Si wafer 206 is placed on the supporting unit 214 which has a moving mechanism 212 as is the case with the deposition system 260 described in the second embodiment. The Si wafer 206 can thus be displaced in the height direction. Moreover, in the deposition system 262 of the present embodiment, a partition plate 264 is arranged at a position lower than the inlet of the annealing gas and higher than the inlets of the other gases. An outlet for exhausting the source gas and the reactive gas is formed in the lower part of the deposition chamber 216. Besides, an annealing gas outlet 266 for exhausting the purge gas or the annealing gas is formed in the upper part of the deposition chamber 216. Here, the annealing gas outlet lies above the partition plate 264. The stage 268 and the gas supply channels have the same structures as in FIG. 4.

The Si wafer 206 is moved by the moving mechanism 212 so that the quartz cover 258, the supporting unit 214, the Si wafer 206 on the supporting unit 214, and the partition plate 264 form a division wall together. This forms two small chambers inside the deposition chamber 216. In a conventional deposition system, the interior of the deposition chamber is intended for deposition alone. For annealing, the Si wafer 206 must be taken out of the system and transported to a separate annealing system. Otherwise, even when the Si wafer 206 is not taken out of the deposition system 260, it must be transported to an annealing chamber separate from the deposition chamber. In contrast, in the deposition system 262, the partition plate 264 suitably forms a small chamber for annealing inside the deposition chamber 216. This configuration makes it possible to heat and cool the Si wafer 206 even more efficiently.

In performing thermal annealing on the Si wafer 206, as shown in FIG. 10, the moving mechanism 212 is adjusted so that the sides of the partition plate 264 come into contact with the sides of the Si wafer 206 or the sides of the stage 268. As a result, the annealing gas is only supplied to and exhausted from the small chamber above the partition plate 264 while the flow of the annealing gas into the chamber below the partition plate 264 is blocked. Consequently, erosion of the inner walls of the deposition chamber 216, ascribable to contact of the annealing gas and the reactive gas inside the deposition chamber 216, can be suppressed suitably. For example, suppose that a reductant gas $NH_3$ is selected as the annealing gas, and an oxidant gas $H_2O$ is selected as the reactive gas. If the two gases make contact with each other in the deposition chamber 216, they may promote erosion of the inner walls of the deposition chamber 216. This can be suppressed, however, by the provision of the partition plate 264. The same holds when an oxidant gas is selected as the annealing gas and a reductant gas is selected as the reactive gas. In addition, it is possible to suppress a drop in the degree of vacuum ascribable to the presence of the reactive gas (such as $H_2O$) above the partition plate 264. Besides, the small chamber above the partition plate 264 of the deposition chamber 216 can be reduced further in volume ratio with respect to the flow rate of the annealing gas. The annealing gas can thus be supplied more efficiently. When thermal annealing is performed in this state, the Si wafer 206 can be heated even more rapidly since it lies closer to the RTP unit 202.

Now, in order to cool the Si wafer 206 after the annealing, the moving mechanism 212 is adjusted to position the Si wafer 206 below the inlet of the purge gas as shown in FIG. 11. Here, the annealing gas outlet 266 arranged in the upper part of the deposition chamber 216 and the outlet formed in the lower part of the deposition chamber 216 both are used for exhaust. The cooling can thus be performed even more efficiently. This makes it possible to lower the temperature more sharply.

Incidentally, while the deposition system 262 is configured so that the sides of the partition plate 264 come into contact with the sides of the Si wafer 206 or the sides of the stage 268, there may be a predetermined clearance.

Fourth Embodiment

Figure 15:
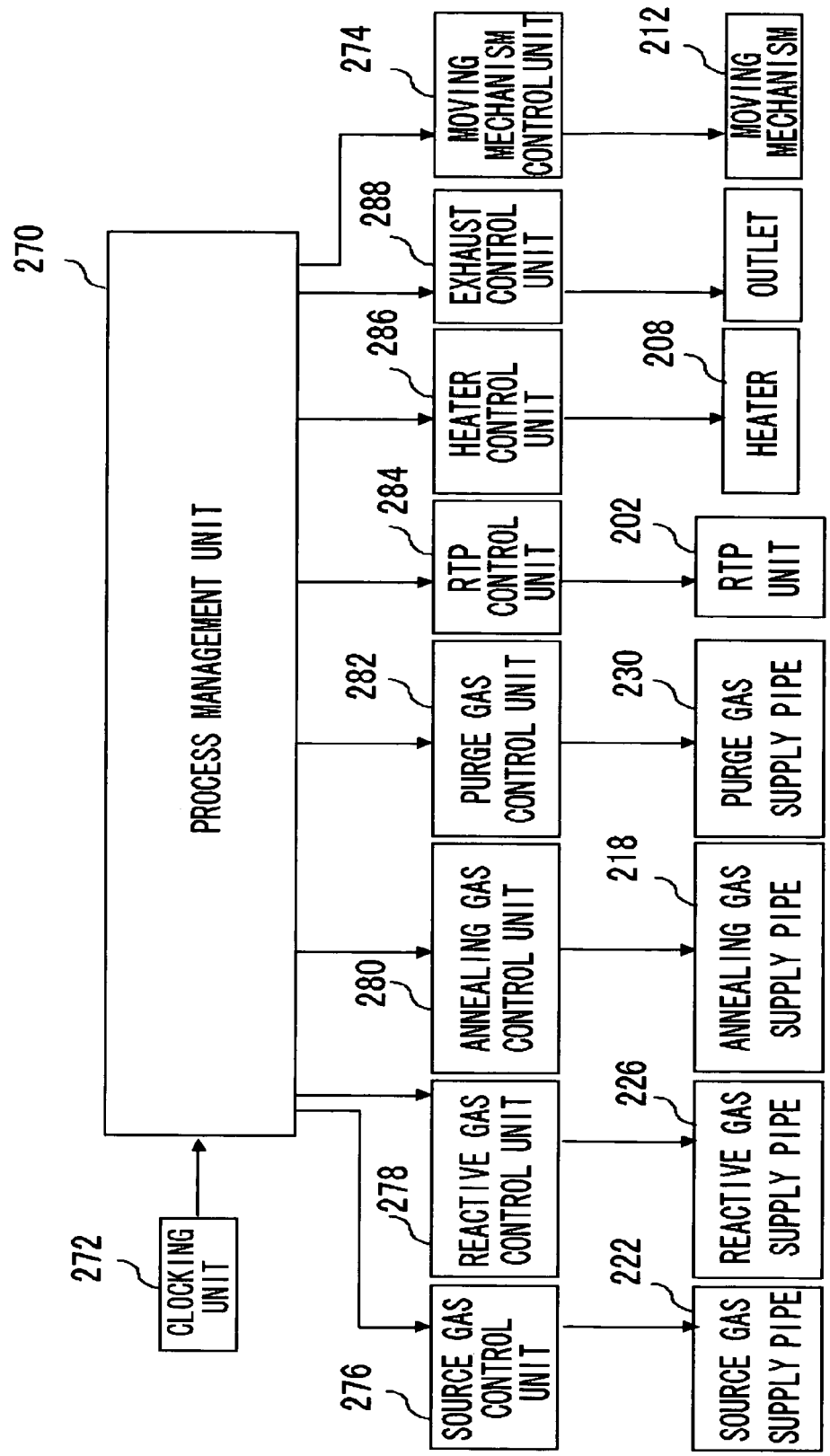
FIG. 15 is a diagram for explaining a method of process management in the deposition system according to an embodiment.

The process management in the foregoing embodiments may be conducted, for example, in the following manner. FIG. 15 is a diagram for explaining a method of process management in the foregoing deposition systems.

In FIG. 15, a process management unit 270 exercises schedule management on each individual process based on time information input from a clocking unit 272. This schedule management will now be described along the flowchart of FIG. 5, assuming the case of the deposition system 260 described in the second embodiment. A source gas control unit 276 controls the amount of the source gas to be supplied from the source gas supply pipe 222 (S101). Here, the temperature of the heater 208 in the deposition process is controlled by a heater control unit 286. At the stage when the source gas has been supplied from the source gas supply pipe 222 for a certain period of time, the source gas control unit 276 stops the supply of the source gas. An exhaust control unit 288 makes the deposition chamber 216 exhausted through the outlet (S102) After a lapse of a predetermined time, the exhaust is stopped.

Next, the reactive gas is supplied from the reactive gas supply pipe 226 for a predetermined time (S103). The supply of the reactive gas is controlled by a reactive gas control unit 278. After the reactive gas has been supplied for the certain period of time, the reactive gas control unit 278 stops the supply of the reactive gas. The exhaust control unit 288 makes the deposition chamber 216 exhausted (S104). After a lapse of a predetermined time, the exhaust is stopped.

Then, a moving mechanism control unit 274 operates the moving mechanism 212 for a predetermined time, so that the Si wafer 206 approaches the RTP unit 202. An RTP control unit 284 makes the RTP unit 202 start heating. An annealing gas control unit 280 supplies the annealing gas from the annealing gas supply pipe 218 to the deposition chamber 216 for a certain period of time (S105). After a lapse of a predetermined time, the heating of the RTP unit 202 and the supply of the annealing gas are stopped. A purge gas control unit 282 starts supplying the purge gas from the purge gas supply pipe 230, and the exhaust control unit 288 starts exhausting air from the outlet. The operations described above are repeated until a predetermined time. When the predetermined time has elapsed (Yes at S107), film refining processing is performed as in S105, thereby completing deposition.

The foregoing sequences are managed by the process management unit. The sequences shown in FIG. 7 can also be performed based on the method of the present embodiment.

Incidentally, the process management shown in FIG. 15 may be scheduled such that the annealing gas is supplied at predetermined timing after the start of the heating by the RTP unit 202.

Fifth Embodiment

Figure 16:
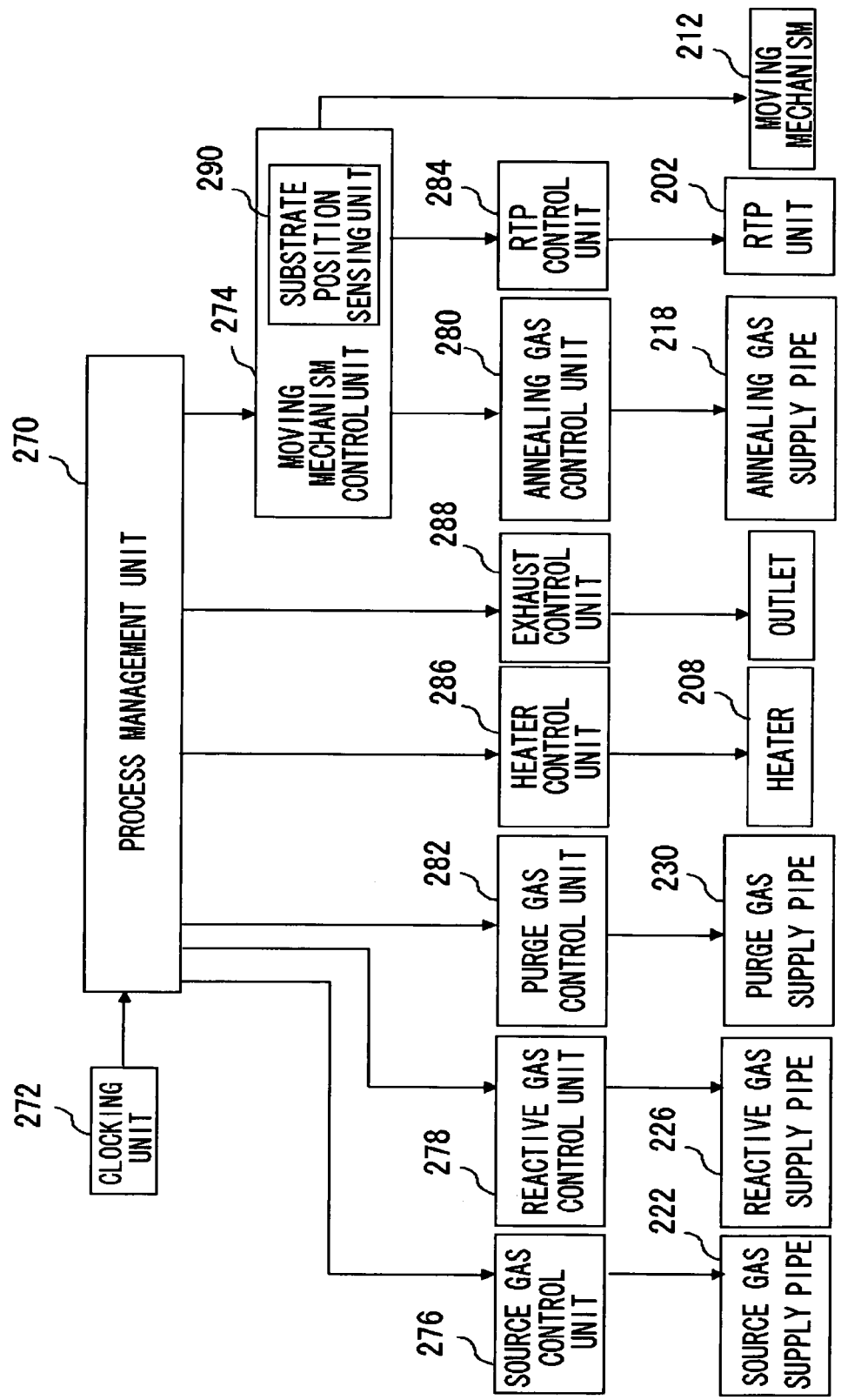
FIG. 16 is a diagram for explaining another method of process management in the deposition system according to the embodiment.

The process management described in the fourth embodiment may also be exercised, for example, in the following manner. FIG. 16 is a diagram for explaining another method of process management in the foregoing deposition systems.

In FIG. 16, while the moving mechanism control unit 274 controls the operation of the moving mechanism 212, it also controls the operations of the annealing gas control unit 280 and the RTP control unit 284 based on the position of the Si wafer 206 sensed by a substrate position sensing unit 290. Consequently, when the Si wafer 206 is moved to a predetermined position, the RTP control unit 284 makes the RTP unit 202 start heating, and the annealing gas control unit 280 starts the supply from the annealing gas supply pipe 218. Here, the supply of the annealing gas may be scheduled so as to be started after a predetermined time since the heating of the RTP unit 202.

This makes it possible to perform deposition and thermal annealing with even higher reliability, thereby obtaining a film of favorable quality stably. The sequences shown in FIG. 7 may also be performed based on the method of the present embodiment.

Sixth Embodiment

The present embodiment relates to anther example of the deposition method that uses the deposition system 260 described in the second embodiment (FIGS. 8 and 9). The present embodiment will deal with an example where annealing is performed in an atmosphere containing a nitrogen compound gas so that nitrogen is diffused into a metal compound layer. The RTP unit 202 shall be an infrared lamp.

Hereinafter, description will be given of the case where $Al_2O_3$ and AlON are layered in this order on a silicon substrate by ALD.

Figure 12:
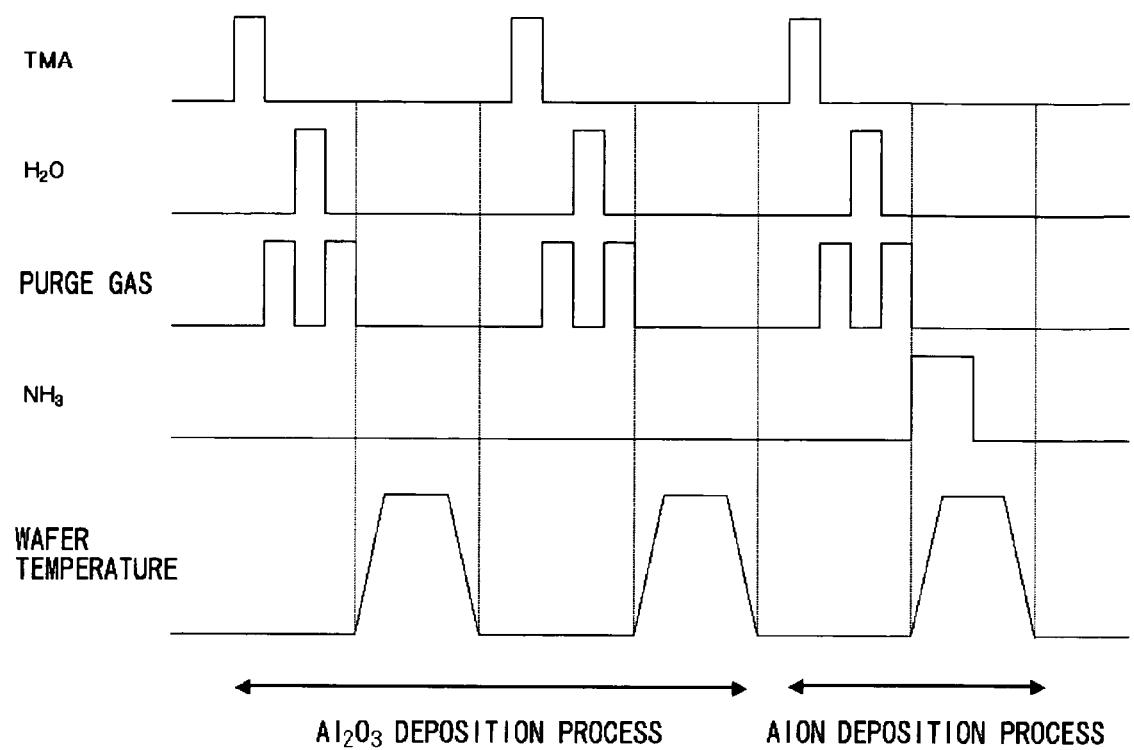
FIG. 12 is a diagram showing the sequence of gas supply and wafer temperature control in the method of forming a high dielectric constant thin film according to an embodiment.

FIG. 12 shows the gas supply and the temperature profile in the deposition process. This profile can be achieved, for example, by the method described in the fourth embodiment or the fifth embodiment. Initially, trimethyl aluminum (TMA), the source gas, is introduced to form an aluminum atomic layer. Subsequently, the deposition chamber 216 is purged inside by using the purge gas. Then, $H_2O$ gas, the reactive gas, is introduced to form an oxygen atomic layer. Both the aluminum atomic layer and the oxygen atomic layer are formed at temperatures of around 200° C. to 450° C.

Next, thermal annealing is performed for the sake of impurity removal and film densification. The annealing temperature and time are 600° C. to 1050° C. and 1 to 600 sec, for example. The rate of temperature rise during annealing is 100° C./sec or higher.

The series of steps describe above are repeated a plurality of times to stack metal oxide layers.

Subsequently, when a predetermined thickness is reached, nitrogen introduction processing is performed. That is, as shown in FIG. 12, $NH_3$ is supplied during annealing. Consequently, nitrogen is introduced and diffused into the layer. The annealing conditions here are the same as described above.

In this way, a high dielectric constant thin film having $Al_2O_3$ and AlON layered in this order can be formed.

According to the method of the present embodiment, sophisticated control on the amount of nitrogen to be introduced can be effected by such means as an adjustment to the annealing conditions. Moreover, a desired distribution of nitrogen concentration can be formed stably inside the high dielectric constant thin film.

When nitrogen is introduced into the metal oxide film, the crystallization temperature of the film increases for improved film quality. The chemical stability improves as well. In the meantime, the resulting film has such characteristics as a lower barrier against electron and a propensity to trapping electron. Thus, if nitrogen can be introduced into the metal oxide film with a certain distribution of nitrogen concentration to form high-nitrogen and low-nitrogen regions, then it becomes possible to achieve excellent device performance previously unavailable. Since the method of the present embodiment allows precise control on such a distribution of nitrogen concentration, it can be suitably used for device manufacturing steps.

While the present embodiment uses the deposition system 260, the deposition systems 200 and 262 may also be used.

Seventh Embodiment

The sixth embodiment has dealt with the case where annealing is performed each time an atomic layer is formed. In contrast, the present embodiment adopts a method of performing annealing after a plurality of atomic layers are stacked.

The present embodiment will deal with the case where $Al_2O_3$ and AlON are layered in this order on a silicon substrate by ALD. Here, the deposition system 260 described in the second embodiment (FIGS. 8 and 9) is used, for example.

Figure 13:
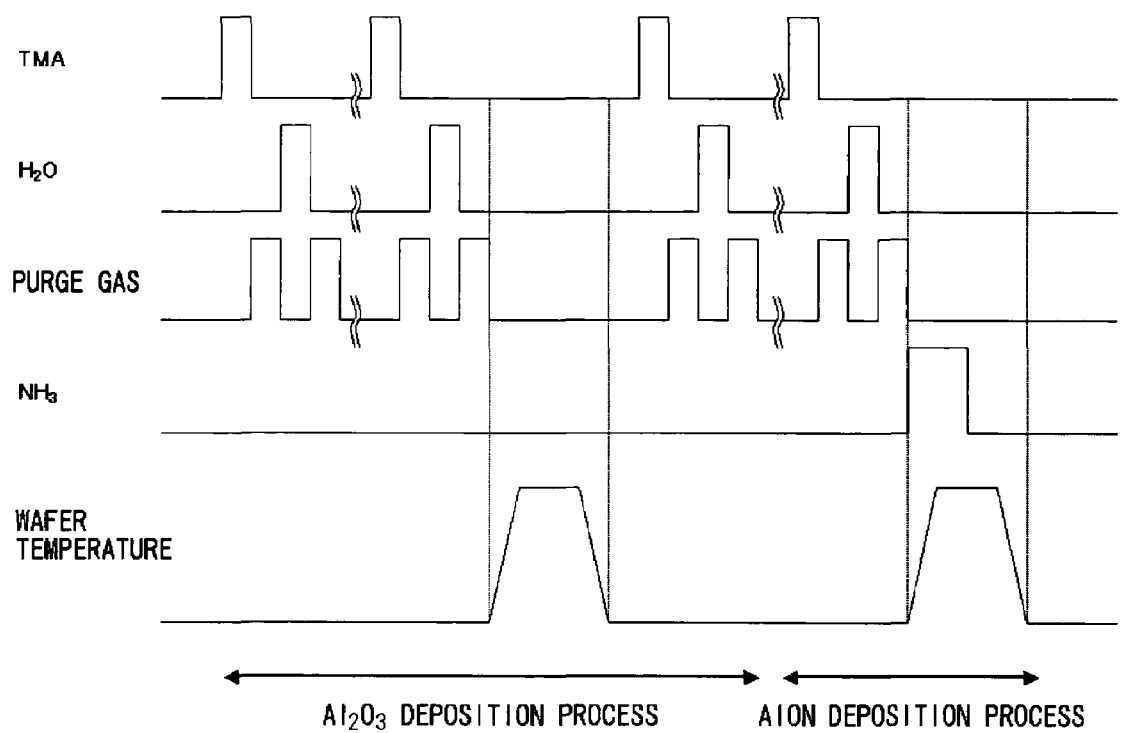
FIG. 13 is a diagram showing the sequence of gas supply and wafer temperature control in the method of forming a high dielectric constant thin film according to another embodiment.
Figure 14:
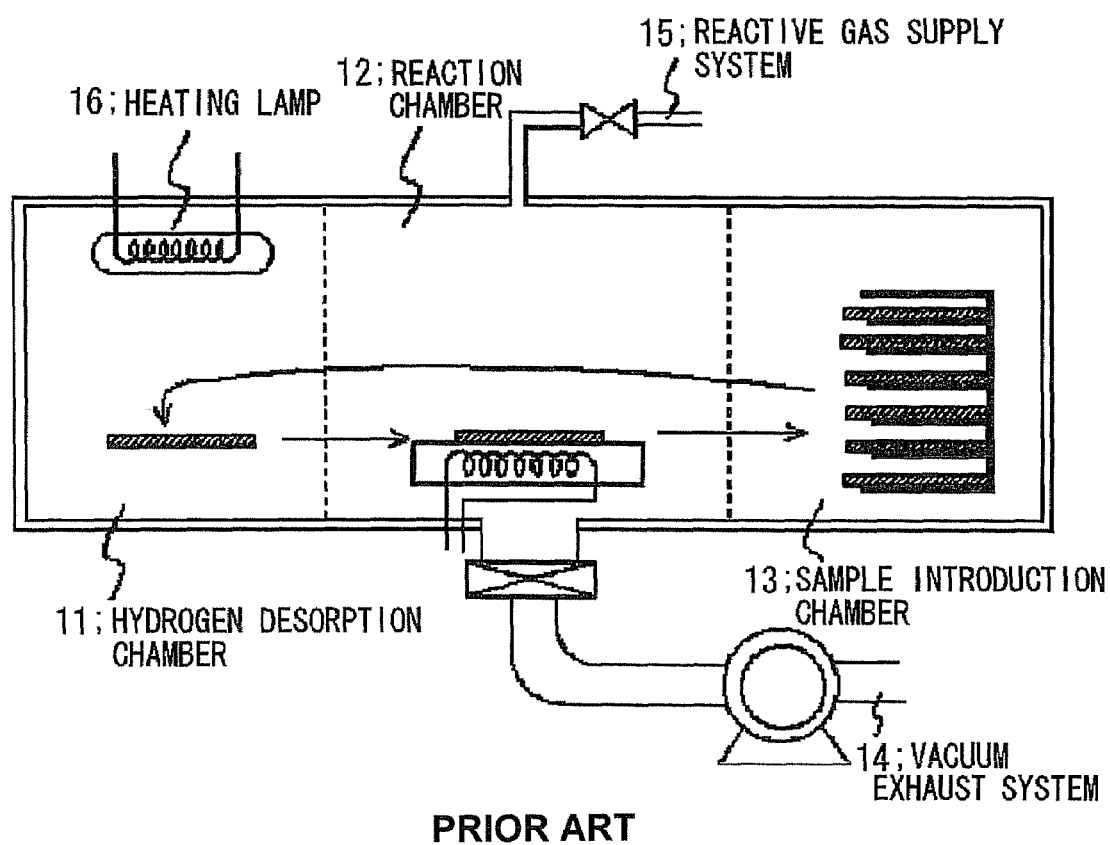
FIG. 14 is a diagram showing the configuration of a conventional deposition system.

FIG. 13 shows the gas supply and the temperature profile in the deposition process. This profile can be achieved, for example, by the method described in the fourth embodiment or the fifth embodiment. Initially, trimethyl aluminum (TMA), the source gas, is introduced to form an aluminum atomic layer (step A). The deposition chamber 216 is purged inside by using the purge gas. Then, $H_2O$ gas, the reactive gas, is introduced to form an oxygen atomic layer (step B). Both aluminum and oxygen are deposited at temperatures of around 150° C. to 450° C.

The foregoing steps A and B are performed for two to five cycles, thereby forming an $Al_2O_3$ layer.

Next, thermal annealing is performed for the sake of impurity removal and film densification. The annealing temperature and time are 600° C. to 1050° C. and 1 to 600 sec, for example. The rate of temperature rise during annealing is 100° C./sec or higher (step C).

Subsequently, the foregoing steps A and B are performed for two to five cycles to form an $Al_2O_3$ layer, followed by the thermal annealing of step C. During this annealing, a nitrogen compound gas is introduced into the deposition chamber (step D). Here, ammonia is introduced. As a result, nitrogen is introduced into the aluminum oxide layer, thereby forming an AlON layer.

A high dielectric constant thin film having $Al_2O_3$ and AlON layered in this order can thus be formed by using the process described above.

While the present embodiment uses the deposition system 260, the deposition systems 200 and 262 may also be used.

In the present embodiment, annealing is performed after the formation of several atomic layers. A high dielectric constant material film of favorable quality can thus be obtained through the simple process.

Up to this point, description has been given of the embodiments of the present invention. It will be understood by those skilled in the art that the foregoing embodiments are given for illustration purpose only, and various modifications may be made thereto. All such modifications are also intended to fall within the scope of the present invention.

What is claimed is:

1. A deposition system which supplies a source gas and a purge gas alternately for deposition, comprising:
    a deposition chamber;
    a substrate holding unit which holds a substrate in the deposition chamber;
    a source gas supply unit which supplies the source gas to the deposition chamber;
    a reactive gas supply unit which supplies a reactive gas to the deposition chamber;
    a purge gas supply unit which supplies the purge gas to the deposition chamber;
    an exhaust unit which exhausts the source gas, the reactive gas, and the purge gas from the deposition chamber;
    a first heating unit which heats the substrate arranged in the deposition chamber to maintain the same to a predetermined temperature;
    a second heating unit which heats the substrate arranged in the deposition chamber rapidly;
    an annealing gas introducing unit which introduces an annealing gas into the deposition chamber; and
    a partition plate positioned lower than an inlet of the annealing gas introducing unit and higher than inlets of the reactive gas supply unit, the source gas supply unit, and the purge gas supply unit, the partition plate having a single center opening;
    wherein the first heating unit is a heater formed on a substrate holding surface of the substrate holding unit;
    the substrate holding unit has a moving mechanism which moves the substrate in position so that the distance between the substrate and the second heating unit can be adjusted by an operation from outside the deposition chamber without opening the deposition chamber, and
    the substrate holding unit and the partition plate are structure such that the substrate holding unit contacts the partition plate when the substrate holding unit is in a raised position; and
    the substrate holding unit and the partition plate are structured such that the substrate is accessible to the annealing gas through the center opening in the partition plate when the substrate holding unit is in the raised position.

2. The deposition system according to claim 1, wherein the first heating unit and the second heating unit are opposed to each other with the substrate interposed therebetween, so that the first heating unit heats the substrate from the backside and the second heating unit heats the substrate from the surface.

3. The deposition system according to claim 1, wherein the second heating unit is an RTP (Rapid Thermal Processing) unit.

4. The deposition system according to claim 1, wherein the second heating unit is arranged outside the deposition chamber.

5. The deposition system according to claim 1, further comprising an annealing gas introducing unit which introduces an annealing gas into the deposition chamber.

6. The deposition system according to claim 1, wherein when the substrate is put closer to the second heating unit by the moving mechanism, the substrate or the substrate holding unit sections the deposition chamber into a first chamber having the annealing gas introducing unit and a second chamber having the source gas supply unit and the reactive gas supply unit so that the surface of the substrate is exposed to the first chamber.

7. The deposition system according to claim 1, further comprising a control unit which controls the operation of the second heating unit and the moving mechanism, the control unit being configured to start heating the substrate by using the second heating unit after the substrate is put closer to the second heating unit by the moving mechanism.

8. The deposition system according to claim 7, wherein the exhaust unit is also controlled by the control unit so that it can exhaust air from the entire deposition chamber when the substrate is put away from the second heating unit by the moving mechanism.

9. The deposition system according to claim 1, further comprising:
    a control unit which controls the operation of the second heating unit, the annealing gas introducing unit, and the moving mechanism, and wherein
    the control unit starts heating the substrate by using the second heating unit and introduces the annealing gas to the deposition chamber from the annealing gas introducing unit when the substrate is put closer to the second heating unit by the moving mechanism.

* * * * *